(12) United States Patent
Yang et al.

(10) Patent No.: US 8,873,020 B2
(45) Date of Patent: Oct. 28, 2014

(54) CLEANING NOZZLE FOR ADVANCED LITHOGRAPHY PROCESS

(75) Inventors: Ching-Hai Yang, Taipei (TW); Shang-Sheng Li, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 274 days.

(21) Appl. No.: 13/216,310

(22) Filed: Aug. 24, 2011

(65) Prior Publication Data

US 2013/0052591 A1     Feb. 28, 2013

(51) Int. Cl.
*G03B 27/32*     (2006.01)
*B05B 17/04*     (2006.01)
*H01L 21/67*     (2006.01)
*B05B 15/02*     (2006.01)

(52) U.S. Cl.
CPC ............ *H01L 21/6715* (2013.01); *B05B 15/02* (2013.01); *H01L 21/67051* (2013.01); *B05B 15/0258* (2013.01)
USPC ............................................. 355/27; 118/300

(58) Field of Classification Search
CPC   B05B 15/02; B05B 15/0258; H01L 21/6715; H01L 21/67051
USPC ................... 134/103.2; 118/300, 696; 355/27
See application file for complete search history.

(56) References Cited

U.S. PATENT DOCUMENTS

| | | | | |
|---|---|---|---|---|
| 6,159,654 | A | * | 12/2000 | Machida et al. ............ 430/270.1 |
| 2007/0232073 | A1 | * | 10/2007 | Oshima ......................... 438/745 |
| 2009/0079948 | A1 | * | 3/2009 | Kitano et al. .................... 355/27 |
| 2010/0310757 | A1 | * | 12/2010 | Ooshiro et al. .................... 427/8 |

* cited by examiner

*Primary Examiner* — Brittany Raymond
(74) *Attorney, Agent, or Firm* — Haynes and Boone, LLP (57) ABSTRACT

The present disclosure provides an apparatus for fabricating a semiconductor device. The apparatus includes a lithography tool. The lithography tool includes: a first nozzle configured to dispense a developer solution to a wafer; a second nozzle configured to dispense a cleaning solution to the first nozzle; and a controller configured to operate the second nozzle according to a predefined program. The present disclosure also provides a method of fabricating a semiconductor device. The method includes performing a developing process, wherein the performing the developing process includes dispensing a developer solution on a wafer using a first nozzle. The method also includes cleaning the first nozzle with a second nozzle, wherein the cleaning the first nozzle is executed according to one of a plurality of program recipes that each specify a sequence and a duration for which the first nozzle and the second nozzle are to be selectively activated.

20 Claims, 7 Drawing Sheets

CLEANING NOZZLE FOR ADVANCED LITHOGRAPHY PROCESS

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component (or line) that can be created using a fabrication process) has decreased.

To achieve the shrinking geometry sizes, advanced lithography processes have been developed. During the lithography process, a general purpose (GP) nozzle is used to dispense a developer solution on a semiconductor wafer. Over time, the tip of the GP nozzle may have a buildup of water drop or water residue, which can adversely affect the intended operation of the GP nozzle. Consequently, semiconductor fabrication performance may be degraded.

Therefore, while existing lithography processes have been generally adequate for their intended purposes, they are not entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
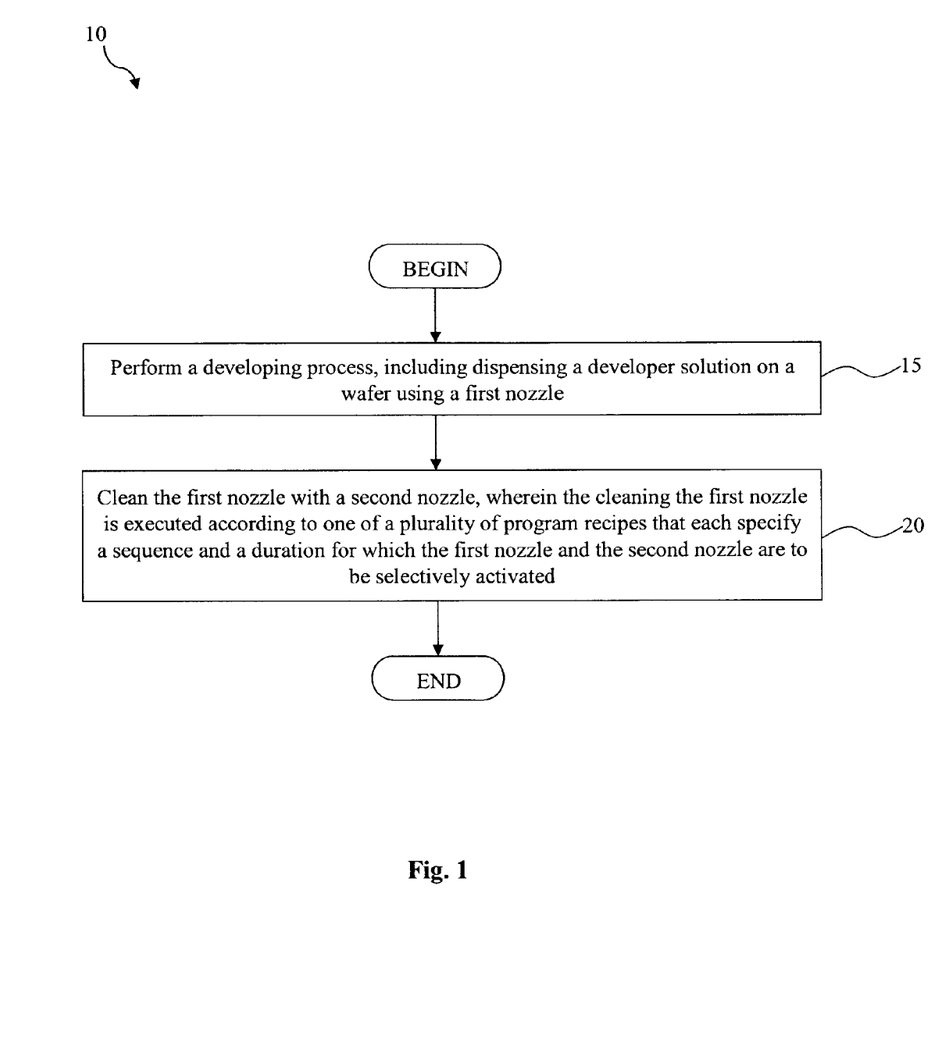
FIG. 1 is a flowchart illustrating a method for performing a lithography process according to various aspects of the present disclosure.

Illustrated in FIG. 1 is a flowchart of a method 10 for performing a lithography process to a semiconductor device. The semiconductor device may be an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that FIGS. 2-3 have been simplified for a better understanding of the inventive concepts of the present disclosure. Accordingly, it should be noted that additional processes may be provided before, during, and after the method 10 of FIG. 1, and that some other processes may only be briefly described herein.

Referring to FIG. 1, the method 10 begins with block 15 in which a developing process is performed. The developing process includes dispensing a developer solution on a wafer using a first nozzle. The developer solution is dispensed out of a dispensing tip of the first nozzle. The method 10 continues with block 20 in which the first nozzle is cleaned with a second nozzle. The cleaning the first nozzle is executed according to one of a plurality of program recipes that each specify a sequence and a duration for which the first nozzle and the second nozzle are to be selectively activated. The second nozzle is positioned at an angle relative to the first nozzle. It is understood that additional lithography processes may be performed before or after the blocks 15 or 20. For example, before the developing process in block 15 is performed, an exposure process may be performed. And after the developing process in block 15 is performed, a baking process such as a hard-baking process may be performed.

Figure 2:
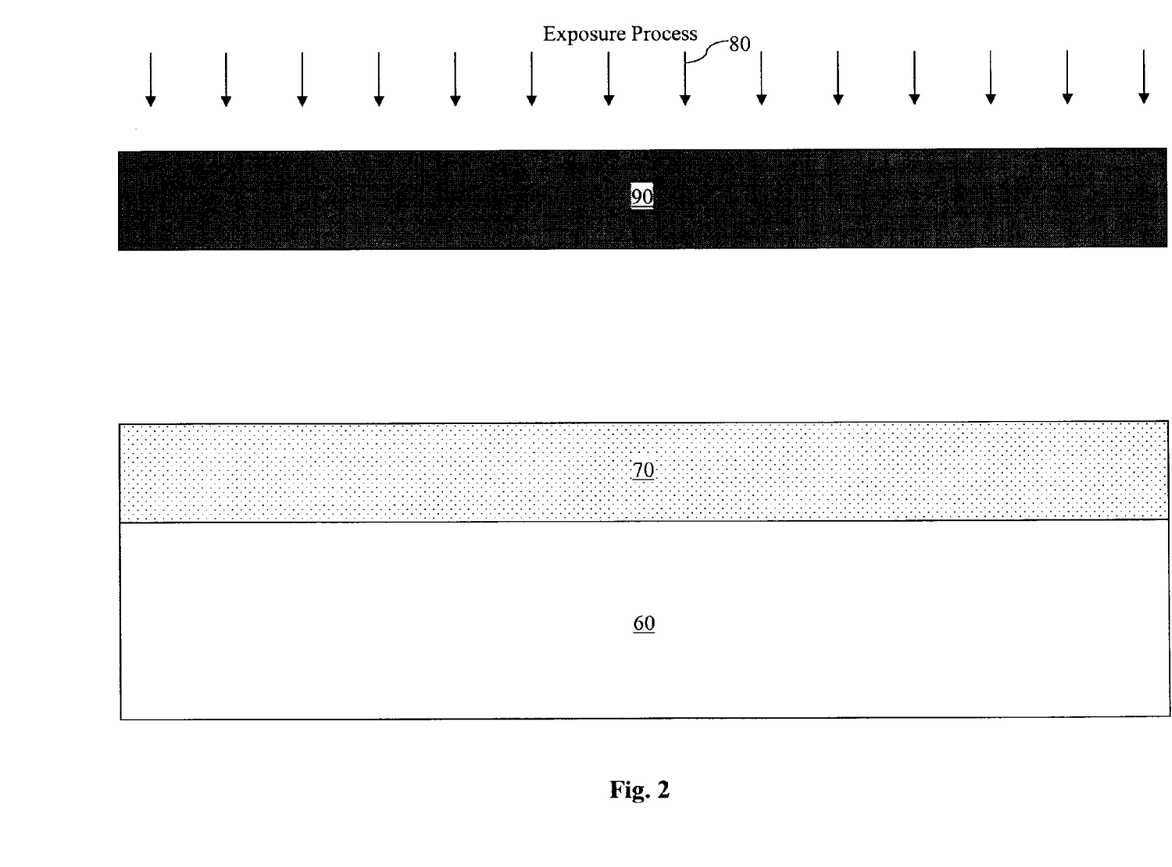
FIGS. 2-3 are diagrammatic cross-sectional side views of a semiconductor wafer at various stages of a lithography process.
Figure 3:
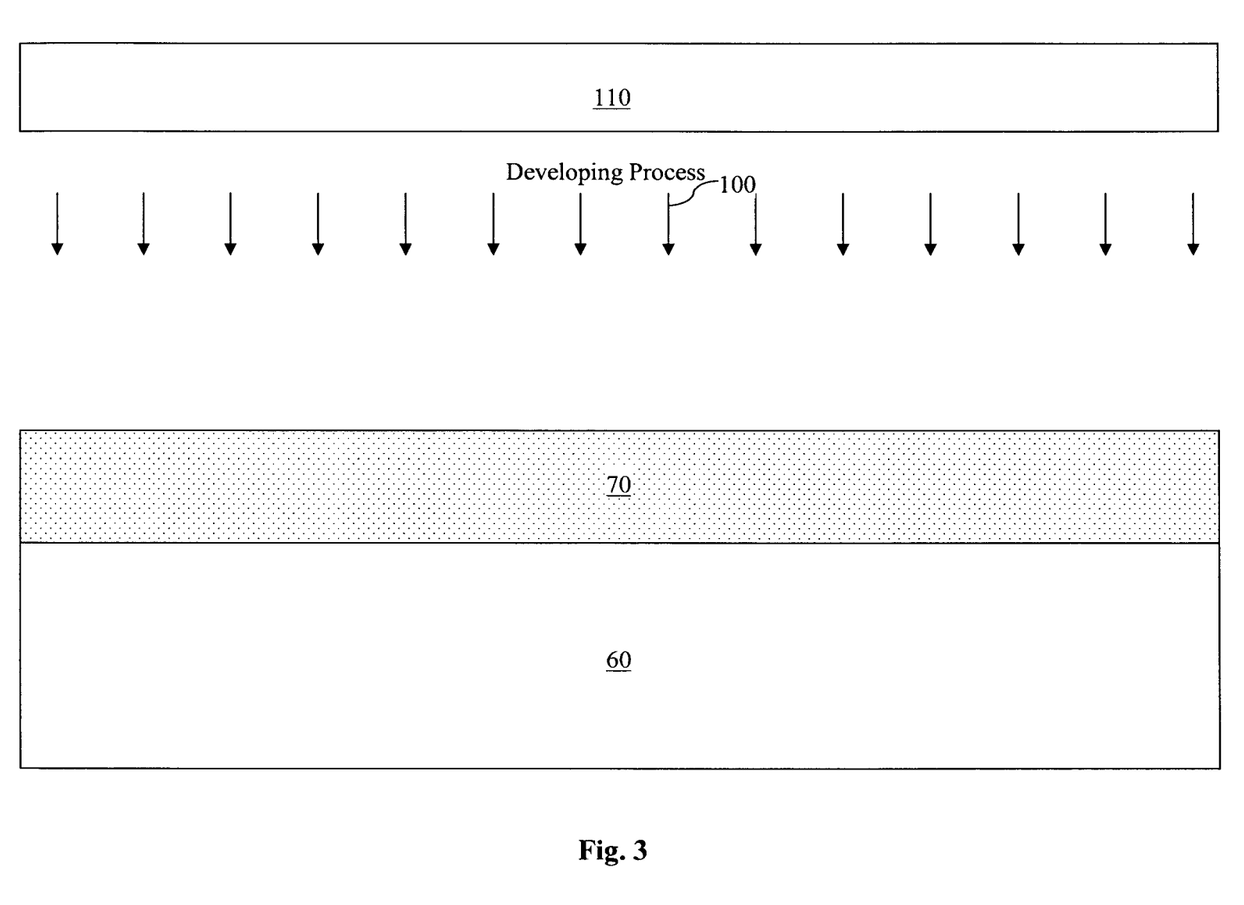

FIGS. 2-3 are diagrammatic fragmentary cross-sectional side views of a portion of a semiconductor device at various stages of fabrication. Referring to FIG. 2, the semiconductor device includes a wafer 60, which may also be referred to as a substrate. The wafer 60 may include a silicon material. The wafer 60 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In one embodiment, the wafer 60 includes various doped features for various microelectronic components, such as complementary metal-oxide-semiconductor field-effect transistors (CMOS-FETs), imaging sensors, memory cells, capacitive elements, inductive elements, and resistive elements.

During the course of semiconductor fabrication, a plurality of lithography processes may be performed on the wafer 60, for example to form the various components therein. A lithography process includes a plurality of steps. For example, a photoresist material 70 may first be formed on the wafer 60 through a spin-coating process known in the art. The wafer 60 (and the photoresist material 70 formed thereon) may then undergo an exposure process 80 that utilizes a photomask 90 to pattern the photoresist material 70 on the wafer 60. The photomask 90 contains images of the features that need to be patterned onto the photoresist material 70. The photomask 90 is placed above the wafer 60, and an imaging system may be used to transfer the image patterns to the photoresist material. Among other components, the imaging system may include a light source and a plurality of lenses, which are not illustrated herein for the sake of simplicity.

Referring to FIG. 3, after the exposure process 80 is performed, the wafer 60 and the photoresist material 70 may undergo a post-exposure soft baking process. Thereafter, a developing process 100 is performed to develop the patterns on the photoresist material 70. A developing module 110 is used to perform the developing process 100. For example the developing module 110 is operable to dispense a developer solution (also referred to as a developing solution) on the photoresist material 70 in order to develop the patterns. The developing module 110 is discussed in more detail below.

Figure 4:
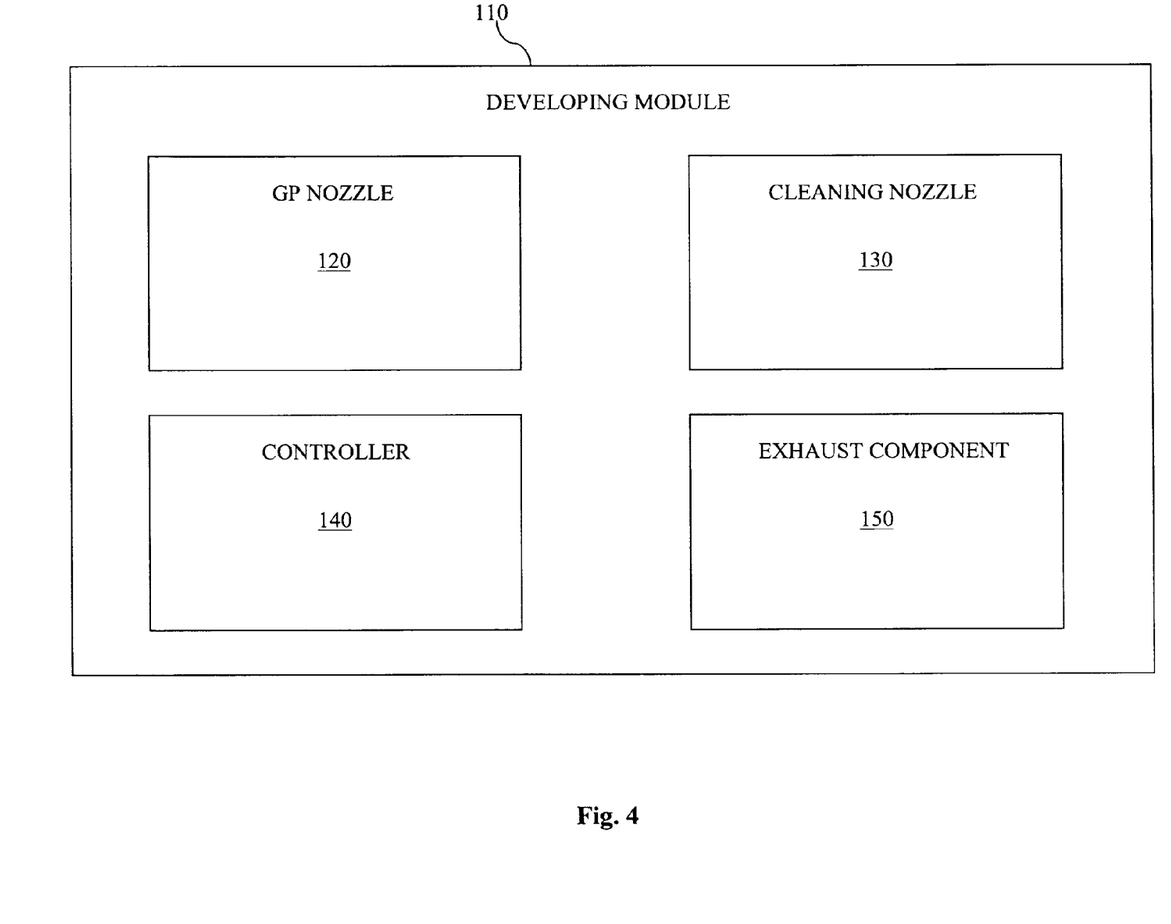
FIG. 4 is a simplified block diagram of a developing module.

Referring now to FIG. 4, a simplified block diagram of the developing module 110 is illustrated. The developing module 110 contains a good performance nozzle (GP nozzle) 120. The GP nozzle 120 has good processing capabilities and good productivity. The GP nozzle 120 is operable to dispense a developer solution to a wafer such as the wafer 60. In an embodiment, the developer solution includes tetramethylammonium hydroxide (TMAH). In alternative embodiments, other suitable developer solutions may be used.

The developing module 110 also contains a cleaning nozzle 130, which is used to clean the GP nozzle 120. Over the course of the GP nozzle 120's operation, liquid residue (for example a water drop or water residue) may be built up at or near a tip of the GP nozzle 120, from where the developer solution is dispensed. This liquid residue buildup may interfere with the intended operation of the GP nozzle 120 (and thus the operation of the developing module 110). Consequently, the performance of the lithography process may be degraded, which may potentially cause defects on the wafer. This is a common problem for existing lithography processes. Here, the developing module 110 utilizes the cleaning nozzle 130 to dispense a cleaning fluid (for example de-ionized water, or DIW) on the tip of the GP nozzle 120 so as to clean the tip of the GP nozzle 120. The cleaning of the tip of the GP nozzle 120 either prevents the buildup of the liquid residue or removes the residue from the tip. The GP nozzle 120 and the cleaning nozzle 130 may be activated according to programmed instructions (or predetermined recipes).

The developing module 110 may further contain a controller 140. The controller 140 may include one or more computer processors and/or memory components and may store and execute software program instructions. The controller 140 is operable to control when and how the GP nozzle 120 dispenses the developer solution on the wafer. The controller 140 is also operable to control the manner in which the cleaning nozzle 130 cleans the tip of the GP nozzle 120. For example, in an embodiment, the controller 140 may instruct the cleaning nozzle 130 to dispense the cleaning fluid at pre-programmed intervals. This aspect of the cleaning nozzle 130 will be discussed in more detail later. In alternative embodiments, the controller 140 may include one or more sensors that can detect when the GP nozzle 120 has dispensed the developer solution and/or whether the tip of the GP nozzle 120 is dirty and needs cleaning. The controller 140 may then determine if the cleaning nozzle 130 needs to dispense the cleaning fluid on the GP nozzle 120 based on the feedback received from the sensor.

The developing module 110 also contains an exhaust component 150. The exhaust component 150 is operable to remove moisture from inside the developing module 110. For example, the exhaust component 150 may include a vacuum pump or a fan. The operation of the exhaust component 150 may also be governed by the controller 140.

Figure 5:
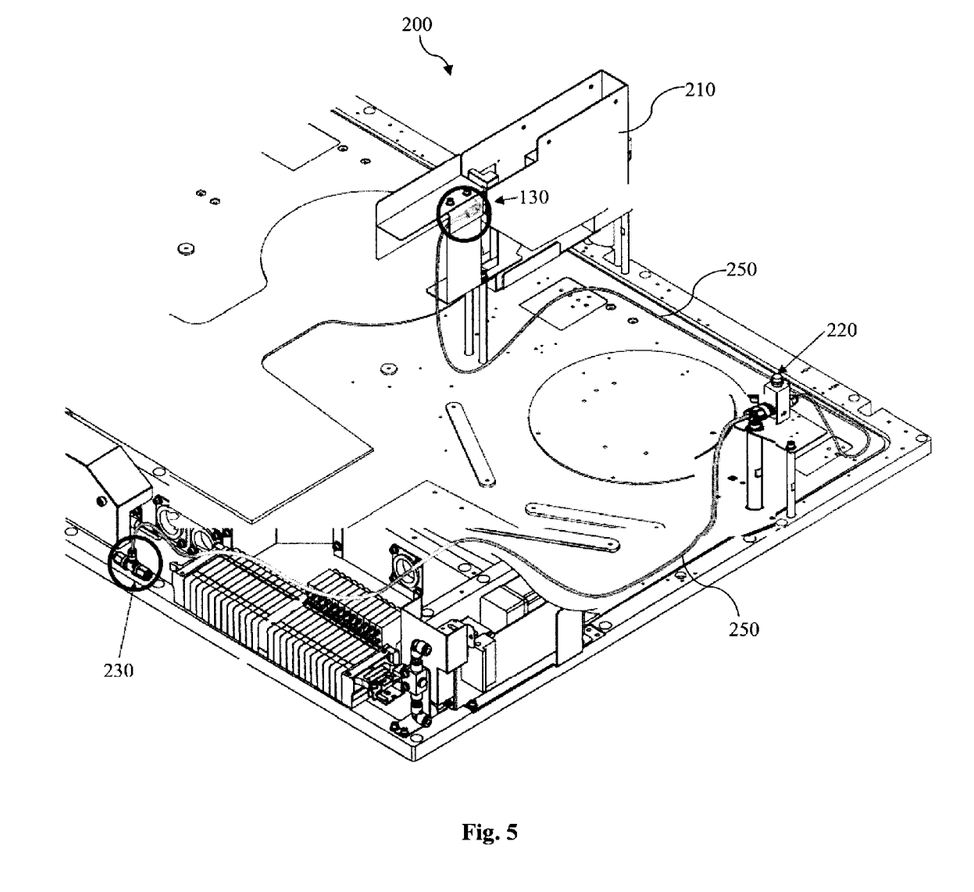
FIG. 5 is a simplified perspective view of a developing module.

FIG. 5 is a diagrammatic perspective view of a portion of a developing module 200 that is an embodiment of the developing module 110 of FIG. 4. The developing module 200 includes a bath assembly 210, an airope assembly 220, and a rinse component 230. In an embodiment, the bath assembly 210 is made of a metal material. A portion of the GP nozzle 120 may be housed within the bath assembly 210, and the GP nozzle 120 is not visible in FIG. 5. The cleaning nozzle 130 is inserted into a slot of the bath assembly 210. As discussed above, the cleaning nozzle 130 is configured to clean the GP nozzle 120 by washing it with a cleaning fluid or solution (for example DIW).

The rinse component 230 can provide the cleaning solution or liquid. In the embodiment illustrated in FIG. 5, the bath assembly 210 (specifically, the cleaning nozzle 130 inserted therein) is coupled to the airope assembly 220 and the rinse component 230 through a hose 250. The hose 250 is configured to transport or deliver the cleaning fluid from the rinse component 230 to the cleaning nozzle 130. During the performance of a lithography process, the cleaning nozzle 130 can deliver the cleaning fluid to the GP nozzle according to a preset program. The GP nozzle 120 can set dummy or lot head interval in GP bath assembly by recipe, and the airope assembly can provide clean DIW for cleaning the GP nozzle.

It is understood that FIG. 5 merely illustrates one example of a developing module 200 and thus is not intended to be limiting. For example, in alternative embodiments, other suitable mechanisms may be used to supply a cleaning fluid to the cleaning nozzle 130, thereby obviating the need to have the rinse component 230 and/or the airope assembly 220. Also, solutions other than DIW may be used as the cleaning fluid to be dispensed by the cleaning nozzle 130. Furthermore, it is understood that the various components of the developing module 200 illustrated in FIG. 5 may be coupled to and operated by a controller component through suitable means, so that the controller component can govern the operation of components such as the GP nozzle 120 or the cleaning nozzle 130. This aspect is not specifically illustrated in FIG. 5 for the sake of simplicity.

Figure 6A:
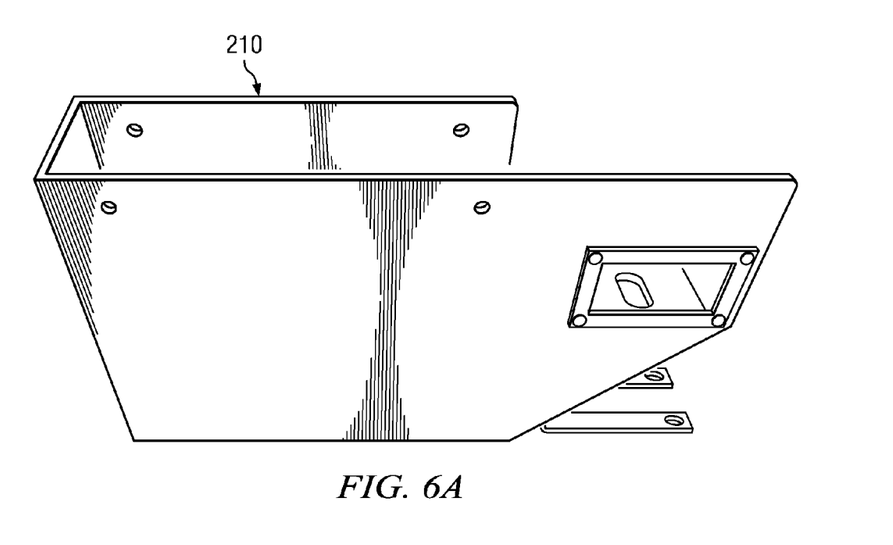
FIGS. 6A and 6B are perspective and top views, respectively, of a bath assembly that is a part of the developing module.
Figure 6B:
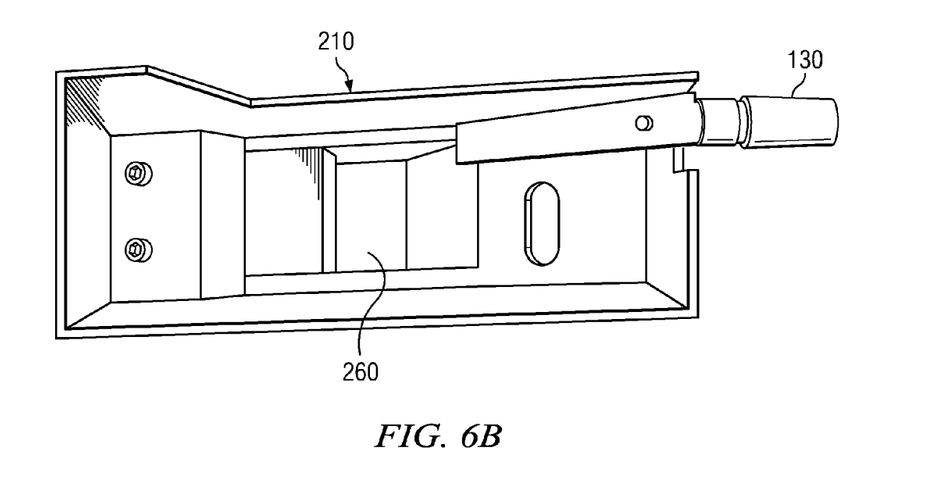

FIGS. 6A and 6B are perspective and top views, respectively, of the bath assembly 210 of FIG. 5. As shown in FIG. 6B, the bath assembly 210 contains a slot 260 (or an opening). In an embodiment, the GP nozzle 120 can be inserted within the slot 260 during its operation and is not visible herein. A tip of the cleaning nozzle 130 is pointed toward the slot 260. The positioning of the cleaning nozzle 130 is implemented in a manner such that the cleaning nozzle 130 can effectively and efficiently dispense a cleaning fluid on the tip of the GP nozzle 120.

Figure 7A:
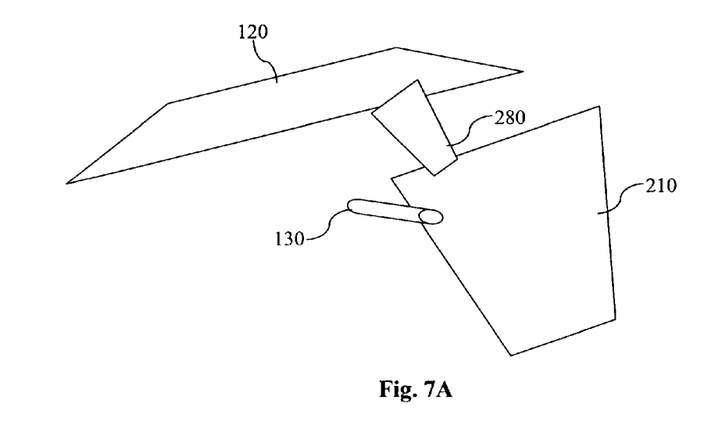
FIGS. 7A and 7B are diagrammatic cross-sectional views of a GP nozzle, a cleaning nozzle, and a bath assembly in two different positional configurations.
Figure 7B:
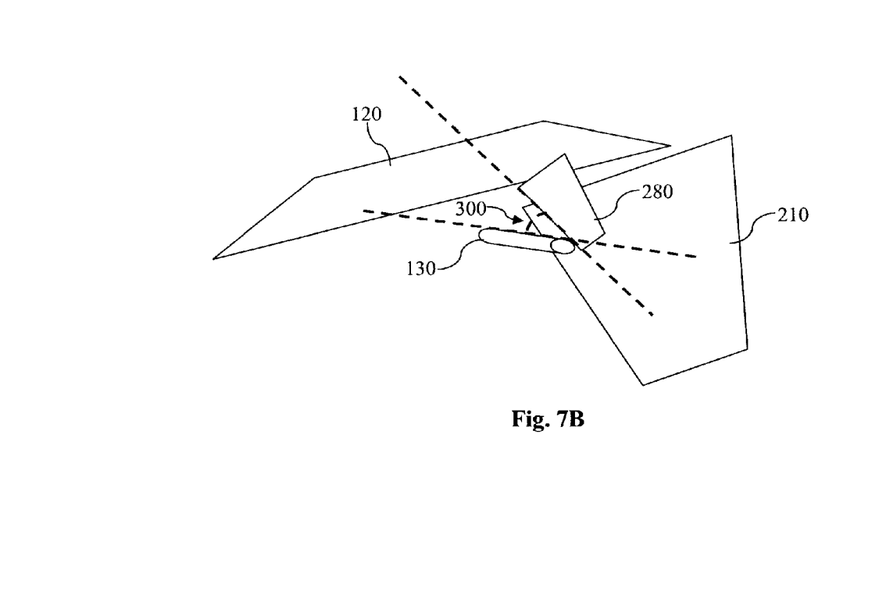

The configuration between the GP nozzle 120 and the cleaning nozzle 130 is illustrated more clearly in FIGS. 7A and 7B, which respectively illustrate diagrammatic cross-sectional views of the GP nozzle 120, the cleaning nozzle 130, and the bath assembly 210 in two separate positional configurations. In more detail, FIG. 7A illustrates a cross-sectional view of the GP nozzle 120, the cleaning nozzle 130, and the bath assembly 210 while the GP nozzle 120 is in an "UP" position, meaning that a tip 280 of the GP nozzle 120 is not wholly inserted in the bath assembly 210. FIG. 7B illustrates a cross-sectional view of the GP nozzle 120, the cleaning nozzle 130, and the bath assembly 210 while the GP nozzle 120 is in a "DOWN" position, meaning that the tip 280 of the GP nozzle 120 is at least partially inserted in the bath assembly 210. In an embodiment, the GP nozzle 120 is typically in the DOWN position. During processing, the GP nozzle 120 will move UP and move out then DOWN to carry out the processing.

The cleaning nozzle 130 forms an insertion angle 300 (also referred to as angle of insertion) with the tip 280 of the GP nozzle 120, as is illustrated in FIG. 7B. In an embodiment, the insertion angle 300 is in a range from about 10 degrees to about 20 degrees. The insertion angle 300 may be adjusted to facilitate the dispensing of the cleaning fluid from the cleaning nozzle 130 onto the GP nozzle 120 and to optimize the effectiveness at which the GP nozzle 120 can be washed. As a result, liquid residue may be prevented or washed away before excessive buildup takes place on the tip 280. During the cleaning, the cleaning nozzle 130 may or may not come into direct physical contact with the GP nozzle 120.

As discussed above, the operation of the GP nozzle 120 and the cleaning nozzle 130 in the developing stage (or step) of the lithography process may be controlled according to program instructions. The program instructions may be referred to as recipes. Two example recipes are listed below as Tables 1 and 2.

TABLE 1

| Step | Loop | Time (seconds) | Operation |
| --- | --- | --- | --- |
| 1 | | 3.0 | GP Nozzle + Bath Exhaust |
| 2 | | 5.0 | Bath Exhaust |
| 3 | | 5.0 | Cleaning Nozzle + Bath Exhaust |
| 4 | | 5.0 | Bath Exhaust |

TABLE 2

| Step | Loop | Time (seconds) | Operation |
| --- | --- | --- | --- |
| 1 | | 5.0 | Cleaning Nozzle + Bath Exhaust |
| 2 | | 5.0 | Bath Exhaust |
| 3 | | 3.0 | GP Nozzle Bath Exhaust |
| 4 | | 5.0 | Bath Exhaust |

In more detail, Table 1 is a recipe referred to as a "Regular Interval Dummy" recipe, and Table 2 is a recipe referred to as a "Pre-PJ Dummy" recipe. In an embodiment, "PJ" refers to a "purge idle" developing solution. The "Regular Interval Dummy" recipe is applied when the GP nozzle has been idle for a predetermined (and programmably adjustable) period of time. In an embodiment, that predetermined period of time is 3600 seconds, meaning that if the GP nozzle has been idle for 3600 seconds, the cleaning nozzle and the bath assembly will be automatically activated (turned on) and will proceed to execute the steps 1-4 of Table 1. For example, in step 1 of the "Regular Interval Dummy" recipe, the GP nozzle and the bath exhaust component (of the bath assembly) will be simultaneously activated. The GP nozzle dispenses a developer solution such as TMAH to a wafer. The bath exhaust component removes moisture from inside the bath assembly. The duration of step 1 lasts for about 3 seconds. In step 2, the exhaust component stays activated to further remove moisture from inside the bath assembly, but the GP nozzle is deactivated (turned off). The duration of step 2 lasts for about 5 seconds. In step 3, the cleaning nozzle and the bath exhaust component are simultaneously activated. The cleaning nozzle is configured to dispense a cleaning fluid (such as DIW) to the tip of the GP nozzle. Meanwhile, the bath exhaust component stays activated to continue to remove moisture from inside the bath assembly. The duration for step 3 lasts for about 5 seconds. In step 4, the exhaust component stays activated to further remove moisture from inside the bath assembly, but the cleaning nozzle is deactivated. The duration of step 4 lasts for about 5 seconds.

With respect to table 2, the "Pre-PJ Dummy" recipe is applied right before the beginning of a lithography process (for example, dispensing of a developer solution). In step 1 of the "Pre-PJ Dummy" recipe, the cleaning nozzle and the bath exhaust component are simultaneously activated. The cleaning nozzle is configured to dispense a cleaning fluid (such as DIW) to the tip of the GP nozzle. The bath exhaust component is activated to remove moisture from inside the bath assembly. The duration of step 1 lasts for about 5 seconds. In step 2, the exhaust component stays activated to further remove moisture from inside the bath assembly, but the cleaning nozzle is deactivated. The duration of step 2 lasts for about 5 seconds. In step 3, the GP nozzle and the bath exhaust component are simultaneously activated. The GP nozzle dispenses a developer solution such as TMAH to a wafer. The bath exhaust component continues to remove moisture from inside the bath assembly. The duration for step 3 lasts for about 3 seconds. In step 4, the exhaust component stays activated to further remove moisture from inside the bath assembly, but the GP nozzle is deactivated. The duration of step 4 lasts for about 5 seconds. The execution of the "Pre-PJ Dummy" recipe resets the idle time for the GP nozzle. For example, if the GP nozzle has been idle for 1200 seconds, and the "Pre-PJ Dummy" recipe is executed, then the idle time for the GP nozzle is reset to 0.

It is understood that each step of the "Regular Interval Dummy" recipe and the "Pre-PJ Dummy" recipe can be looped a number of times. Also, the duration of each step may be different in alternative embodiments. Furthermore, the exact sequence in which the steps are performed may be altered in a suitable manner in different embodiments. It is also understood that additional lithography steps may be performed to the wafer after the developing step. For example, a hard baking step may be performed after the developing step. One or more rinsing processes may also be performed at different stages throughout the lithography process. For the sake of simplicity, the post-developing processes are not discussed in detail herein.

The embodiments disclosed herein offer advantages over existing lithography processes. It is understood, however, that other embodiments may offer additional advantages, and that no particular advantage is required for all embodiments. One advantage is that the embodiments disclosed herein allow a GP nozzle to be effectively cleaned before liquid residue buildup can occur on its tip. For example, after the GP nozzle has been idle for a while, the cleaning nozzle can be automatically activated according to preset program instructions to wash the tip of the GP nozzle with a cleaning solution. Another advantage is that the implementation of the cleaning nozzle is simple according to the present disclosure and does not require excessive modifications of existing developing modules. For example, a cleaning nozzle can be positioned on a bath assembly at an appropriate insertion angle with respect to the GP nozzle, and a hose may be used to deliver a cleaning solution to the cleaning nozzle. The cleaning solution may be provided from an existing component on the developing module, such as an existing rinse component (implemented on the developing module) that is configured to dispense a rinse solution such as DIW.

One of the broader forms of the present disclosure involves an apparatus for fabricating a semiconductor device. The apparatus includes a lithography tool that includes: a first nozzle configured to dispense a developer solution to a wafer; a second nozzle configured to dispense a cleaning solution to the first nozzle; and a controller configured to operate the second nozzle according to a predefined program.

Another one of the broader forms of the present disclosure involves a lithography apparatus. The lithography apparatus includes: a general purpose (GP) nozzle that is operable to dispense a developer solution to a wafer, the developer solution being dispensed from a tip of the GP nozzle; a cleaning nozzle that is positioned near the GP nozzle, wherein the cleaning nozzle is operable to wash the tip of the GP nozzle with a cleaning liquid; and a computerized control device that is operable to control an operation of the GP nozzle and the cleaning nozzle according to one or more program recipes, wherein the one or more program recipes each define a sequence of steps in which the GP nozzle and the cleaning nozzle can be selectively turned on and off.

One more of the broader forms of the present disclosure involves a method of fabricating a semiconductor device. The method includes: performing a developing process, wherein the performing the developing process includes dispensing a developer solution on a wafer using a first nozzle; and cleaning the first nozzle with a second nozzle, wherein the cleaning the first nozzle is executed according to one of a plurality of program recipes that each specify a sequence and a duration for which the first nozzle and the second nozzle are to be selectively activated.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus for fabricating a semiconductor device, comprising:
    a lithography tool that includes:
        a first nozzle configured to dispense a developer solution to a wafer;
        a second nozzle configured to dispense a cleaning solution to the first nozzle;
        an exhaust component configured to remove moisture, wherein the exhaust component includes a vacuum pump or a fan; and
        a controller configured to operate the second nozzle according to a predefined program and configured to operate the exhaust component to remove moisture from inside the lithography tool.

2. The apparatus of claim 1, wherein the first nozzle and the second nozzle are positioned on a bath assembly.

3. The apparatus of claim 1, wherein the second nozzle is configured to wash a tip of the first nozzle using the cleaning solution.

4. The apparatus of claim 1, wherein the second nozzle forms an angle with the first nozzle.

5. The apparatus of claim 4, wherein the angle is in a range from about 10 degrees to about 20 degrees.

6. The apparatus of claim 1, wherein the predefined program includes a recipe that defines a sequence of steps in which the first nozzle and the second nozzle can be selectively activated and deactivated.

7. The apparatus of claim 6, wherein the recipe is executed after the first nozzle has been idle for a predetermined amount of time.

8. The apparatus of claim 6, wherein the recipe is executed before a performance of a lithography process.

9. The apparatus of claim 1, wherein:
    the developer solution includes tetramethylammonium hydroxide (TMAH); and
    the cleaning solution includes de-ionized water (DIW).

10. A lithography apparatus, comprising:
    a general purpose (GP) nozzle that is operable to dispense a developer solution to a wafer, the developer solution being dispensed from a tip of the GP nozzle;
    a cleaning nozzle that is positioned proximate to the tip of the GP nozzle such that the cleaning nozzle is operable to spray a cleaning liquid on the tip of the GP nozzle; and
    a computerized control device that is operable to control an operation of the GP nozzle and the cleaning nozzle according to one or more program recipes, wherein the one or more program recipes each define a sequence of steps in which the GP nozzle and the cleaning nozzle can be selectively turned on and off, and wherein the program recipe includes program instructions for initiating the sequence of steps after the GP nozzle has been idle for a predetermined period of time.

11. The lithography apparatus of claim 10, wherein the cleaning nozzle is positioned relative to the GP nozzle at an insertion angle.

12. The lithography apparatus of claim 10, wherein the program recipe includes program instructions for initiating the sequence of steps before a lithography process is performed.

13. The lithography apparatus of claim 10, wherein:
    the developer solution includes tetramethylammonium hydroxide (TMAH); and
    the cleaning liquid includes de-ionized water (DIW).

14. The lithography system of claim 10, further comprising a vacuum pump or a fan configured to remove moisture from a module inside which the cleaning nozzle and the GP nozzle are located.

15. A lithography apparatus, comprising:
    a general purpose (GP) nozzle that is configured to dispense, from a tip of the GP nozzle, a developer solution to a wafer during a lithography process;
    a cleaning nozzle that is configured to dispense a cleaning solution onto the tip of the GP nozzle, wherein the GP nozzle and the cleaning nozzle are collectively integrated into a developing module;
    a vacuum pump or a fan configured to remove moisture from the developing module; and
    a controller that is communicatively coupled to the GP nozzle and the cleaning nozzle and the vacuum pump or the fan, wherein the controller instructs the GP nozzle and the cleaning nozzle and the vacuum pump or the fan to each be selectively activated according to a program recipe.

16. The lithography apparatus of claim 15, wherein a tip of the cleaning nozzle is positioned adjacent to the tip of the GP nozzle.

17. The lithography apparatus of claim 15, wherein the GP nozzle and the cleaning nozzle form a predetermined insertion angle.

18. The lithography apparatus of claim 17, wherein the insertion angle is in a range from about 10 degrees to about 20 degrees.

19. The lithography apparatus of claim 15, wherein the controller further comprises one or more sensors that are configured to detect whether the tip of the GP nozzle is dirty and needs cleaning.

20. The lithography apparatus of claim 15, wherein the controller is configured to instruct the cleaning nozzle to dispense the cleaning solution onto the tip of the GP nozzle after the GP nozzle has been detected to be idle for a predetermined amount of time.

* * * * *